(12) United States Patent
Long et al.

(10) Patent No.: US 6,641,859 B1
(45) Date of Patent: Nov. 4, 2003

(54) METHOD OF MAKING AN EMISSIVE LAYER FOR AN ORGANIC LIGHT-EMITTING DEVICE

(75) Inventors: Michael E. Long, Bloomfield, NY (US); Ching W. Tang, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 09/590,043

(22) Filed: Jun. 8, 2000

(51) Int. Cl.⁷ .............................. B05D 5/06; B05D 5/12
(52) U.S. Cl. ........................................... 427/66; 427/68
(58) Field of Search ...................... 427/66, 68

(56) References Cited

U.S. PATENT DOCUMENTS

| | | |
|---|---|---|
| 4,356,429 A | 10/1982 | Tang |
| 4,539,507 A | 9/1985 | VanSlyke et al. |
| 4,720,432 A | 1/1988 | VanSlyke et al. |
| 4,769,292 A | 9/1988 | Tang et al. |
| 5,895,692 A * | 4/1999 | Shirasaki et al. ........... 427/557 |
| 6,137,459 A * | 10/2000 | Eida et al. .................... 345/76 |

FOREIGN PATENT DOCUMENTS

WO   99/39373   8/1999

* cited by examiner

*Primary Examiner*—Shrive P. Beck
*Assistant Examiner*—Michael Cleveland
(74) *Attorney, Agent, or Firm*—Raymond L. Owens (57) ABSTRACT

A method of making an electroluminescent device having a substrate, and at least one dopant receiving layer containing a host material which when doped provides an emissive layer, includes providing at least one dopant layer having a dopant disposed over or under the dopant receiving layer; providing an anode and a cathode so that the dopant receiving layer and the dopant layer are disposed between such anode and cathode; and heating the electroluminescent device to cause the dopant to diffuse from the dopant layer into the dopant receiving layer and forming the emissive layer having uniformly dispersed dopant in the host material.

7 Claims, 5 Drawing Sheets

METHOD OF MAKING AN EMISSIVE LAYER FOR AN ORGANIC LIGHT-EMITTING DEVICE

CROSS REFERENCE TO RELATED APPLICATION

Reference is made to commonly-assigned U.S. patent application Ser. No. 09/589,731 filed Jun. 8, 2000,entitled "Organic Electroluminescent Devices With Improved Stability and Efficiency" by T. K. Hatwar et al, the disclosure of which is incorporated herein by reference.

FIELD OF THE INVENTION

The present invention relates to methods of making organic light-emitting devices and, more particularly to methods of providing in a light-emitting layer of an organic light-emitting device formed by diffusing a dopant from a dopant layer to a dopant receiving layer.

BACKGROUND OF THE INVENTION

Organic light-emitting devices, also referred to as organic electroluminescent (EL) devices or as organic internal junction light-emitting devices, contain spaced electrodes separated by an organic light-emitting structure (also referred to as an organic EL medium) which emits light in response to the application of an electrical potential difference across the electrodes. At least one of the electrodes is light-transmissive, and the organic light-emitting structure can have a multi-layer of organic thin films which provide for hole injection and transport from an anode, and for electron injection and transport from a cathode, respectively, with light emission resulting from electron-hole recombination at an internal junction formed at an interface between the hole-transporting and the electron-transporting thin films. As employed herein, the term "thin film" refers to layer thicknesses of less than 1 micrometer with layer thickness of less than about 0.5 micrometer being typical. Examples of organic light-emitting devices containing organic light-emitting structures and cathode constructions formed by thin film deposition techniques are provided by commonly-assigned U.S. Pat. Nos. 4,356,429; 4,539,507; 4,720,432; and 4,769,292.

During operation of an organic light-emitting device, the spectral distribution of emitted light (measured in terms of spectral radiance) is related to the electroluminescent properties of the organic thin films used in the device construction. For example, if an organic light-emitting structure includes a layer which contains a light-emitting host material, the emitted light will be dominated by the light emission from the host material.

The above-cited commonly-assigned U.S. Pat. No. 4,769,292 recognized that advantageous performance features of an organic light-emitting device could be obtained if the device included a luminescent zone (or light-emitting layer) of less than 1 micrometer in thickness and comprised of an organic host material capable of sustaining hole-electron recombination, and a small amount of fluorescent material capable of emitting light in response to energy released by hole-electron recombination. The introduction of a fluorescent material into a layer of a light-emitting host material will modify the color of the light emission, and can improve the operational stability of an organic light-emitting device. In analogy to terminology used in the semiconductor industry, fluorescent materials dispersed uniformly at relatively low concentration in light-emitting organic host materials are called "dopants."

As currently practiced, the organic thin films of a light-emitting device are formed by vapor deposition (evaporation or sublimation) in successive deposition steps within a vacuum system which employs a deposition rate control. When a fluorescent dopant is to be uniformly incorporated within an organic light-emitting layer, the light-emitting host material and the fluorescent dopant material are co-deposited from two independently controlled deposition sources. It is necessary to control the individual deposition rates of a fluorescent dopant and a host material when a desired dopant concentration in the host material of the organic light-emitting layer is at or near a lower end of a dopant concentration range of $10^{-3}$ to about 10 mole percent. The difficulty of reliably controlling the deposition rates of an organic light-emitting host material and of a fluorescent dopant material has been an obstacle in the process of reproducibly fabricating organic electroluminescent devices containing a fluorescent dopant or fluorescent dopants.

Another recent method for fabrication of electroluminescent devices disclosed in WO 99/39373 uses patterning of the components, but does not operate on a completed device, hence requiring breaking of the vacuum to pattern, followed by completion of the device under vacuum or inert atmosphere.

SUMMARY OF THE INVENTION

It is an object of the present invention to provide an improved method of forming a doped emissive layer which overcomes difficulties associated with prior art methods.

Accordingly, it is an object of the present invention to provide a method of making an electroluminescent device having a substrate, an anode provided over the substrate, and at least one dopant receiving layer which when doped provides an emissive layer disposed over the anode and a cathode disposed over the emissive layer, and diffusing the dopant form the dopant layer into the dopant receiving layer.

These objects are achieved in a method of making an electroluminescent device having a substrate, and at least one dopant receiving layer containing a host material which when doped provides an emissive layer, comprising the steps of:

(a) providing at least one dopant layer having a dopant disposed over or under the dopant receiving layer;

(b) providing an anode and a cathode so that the dopant receiving layer and the dopant layer are disposed between such anode and cathode; and (c) heating the electroluminescent device to cause the dopant to diffuse from the dopant layer into the dopant receiving layer and forming the emissive layer having uniformly dispersed dopant in the host material.

An important feature of the invention is that the dopant layer can be patterned prior to diffusing into the dopant receiver layer, thus producing a patterned, multi-color emissive device.

Another feature of the invention is that it separates the deposition of the organic dopant receiver material forming the emissive layer from the deposition of an organic dopant material, and introduces the dopant material into the host material after completion of the processing of the device.

By separating the depositing step of an organic light-emitting layer from the depositing step of a fluorescent dopant layer, each of these layers can be formed separately to a desired thickness, thereby obviating the problems of deposition rate control associated with the prior art method of forming a doped light-emitting layer. Thus, the deposition processes are greatly simplified and require equipment of reduced complexity.

The light-emitting layer of the organic light-emitting host material can be formed by conventional vapor deposition (evaporation, sublimation) and, alternatively, by other coating of a polymeric organic light-emitting material.

The dopant layer can be formed by conventional vapor deposition and, alternatively, by thermally induced transfer from a dopant donor layer formed on a donor support or other printing methods such as ink jet, gravure, offset, screen, flexographic, or xerographic printing.

Two or more dopant layers containing different dopants can be formed in a particular pattern, thereby providing a broader range of options for modifying the light emitted from the light-emitting layer.

Diffusion of a dopant or of dopants from a dopant layer or from dopant layers into an organic light-emitting layer by a heat treatment process of the completed device requires relatively simple equipment and provides accurate control of processing to achieve uniform dispersion of the dopant or dopants throughout the organic light-emitting layer of the host material.

DESCRIPTION OF THE PREFERRED EMBODIMENTS

In the following description of the various methods and process sequences used for making an organic light-emitting device in accordance with aspects of the invention, corresponding elements have been designated with corresponding numerals. Exceptions to this correspondence will be discussed in detail as they arise.

Figure 1A:
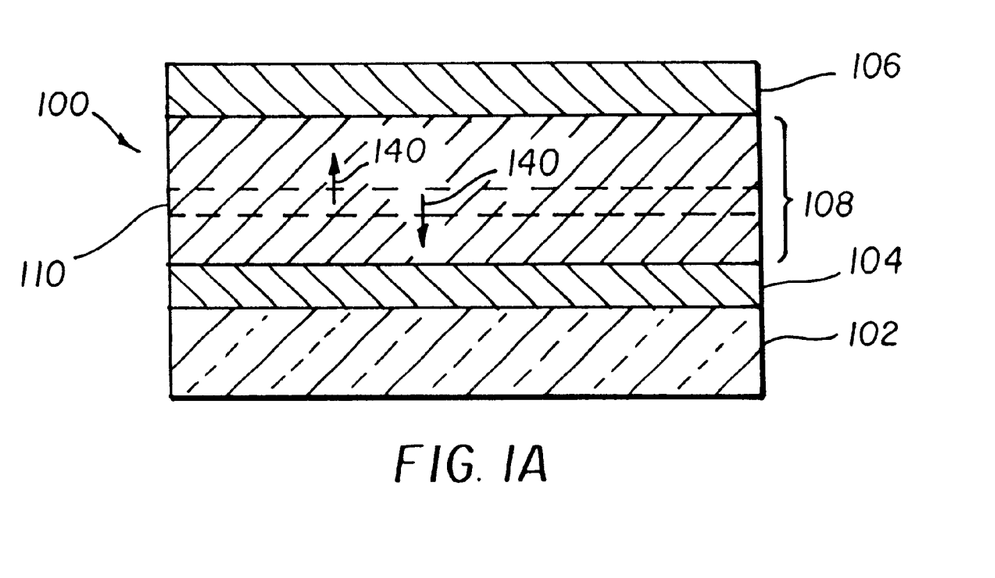
FIG 1A depicts an untreated (by heat) device with the dopant layer placed in the dopant receiving layer.
Figure 1B:
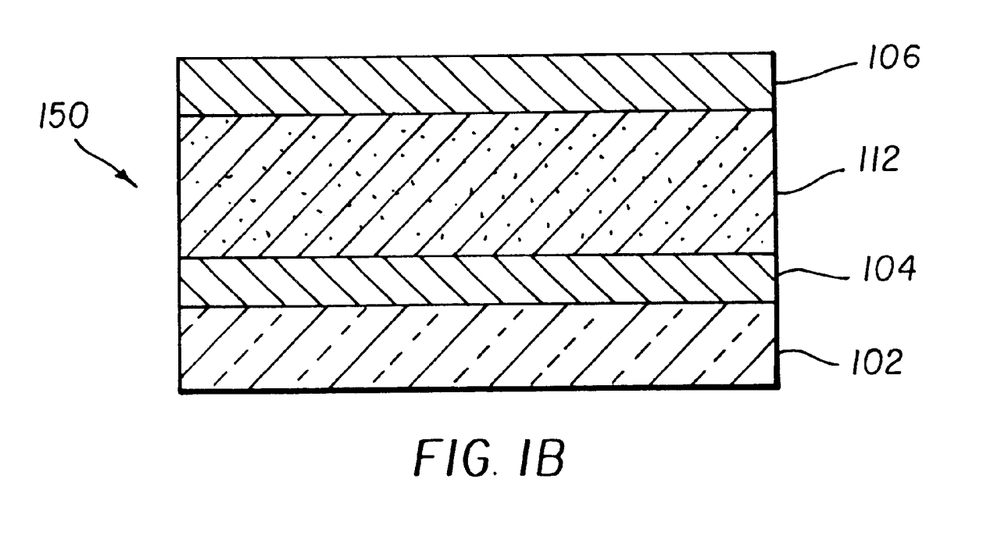
FIG. 1B shows a device of FIG. 1A after heating where the dopant is uniformly dispersed throughout an emissive layer, resulting in light emission from the device which is modified by the dopant diffusion.

Turning now to FIGS. 1A and 1B, there are shown devices which illustrate processing steps for making an organic light-emitting device in accordance with the present invention.

In FIG. 1A, an organic light-emitting device 100 shows, in sequence, a substrate 102, an anode 104, a dopant receiving layer 108 formed over the anode, and a cathode 106 provided over the light-emitting structure. Either, or both, the cathode or the anode can be transparent. Within the dopant receiving layer 108, is placed a dopant layer 110. The direction of diffusion of the dopant layer 110 upon heating, is shown by arrow 140.

FIG. 1B schematically illustrates an organic light emitting structure 150 which is formed after heating the organic light-emitting device 100. Here, the dopant layer 110 has diffused into the dopant receiving layer 108 to form an emissive layer 112. As above, the anode 104, is on the support 102, and a cathode 106 is provided as shown.

Heating can be performed by a variety of methods including, but not limited to heating on a hot plate, oven, infrared lamp, flash lamp, and laser. The temperature range is 50° C. to 250° C. with an optimal temperature near the glass transition point tg, of the materials.

Figure 2A:
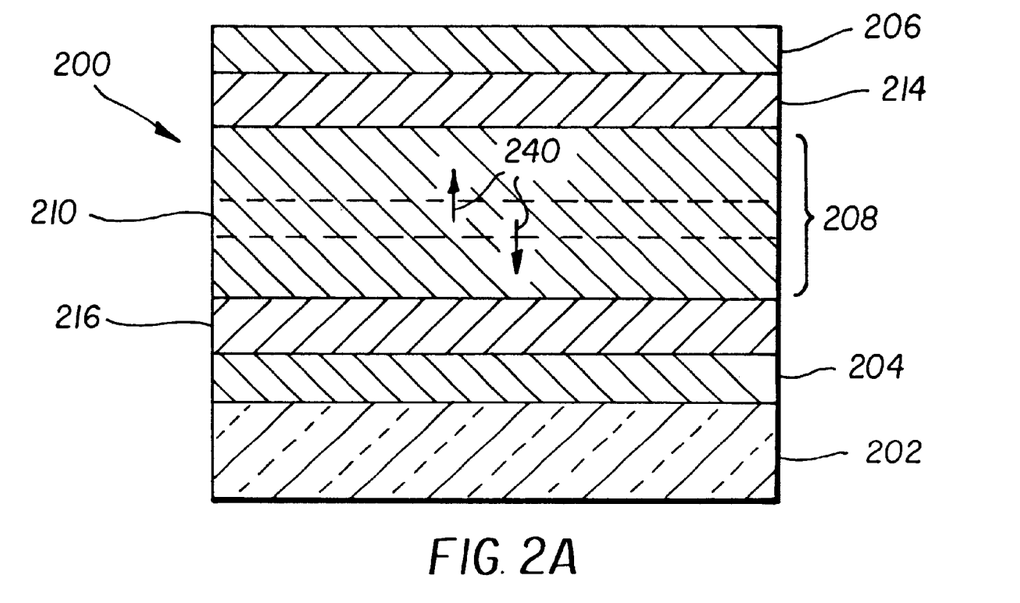
FIG. 2A depicts another preferred embodiment of the present invention having a hole transport layer and an electron transport layer which is unheated or untreated with the dopant layer placed in the dopant receiving layer.
Figure 2B:
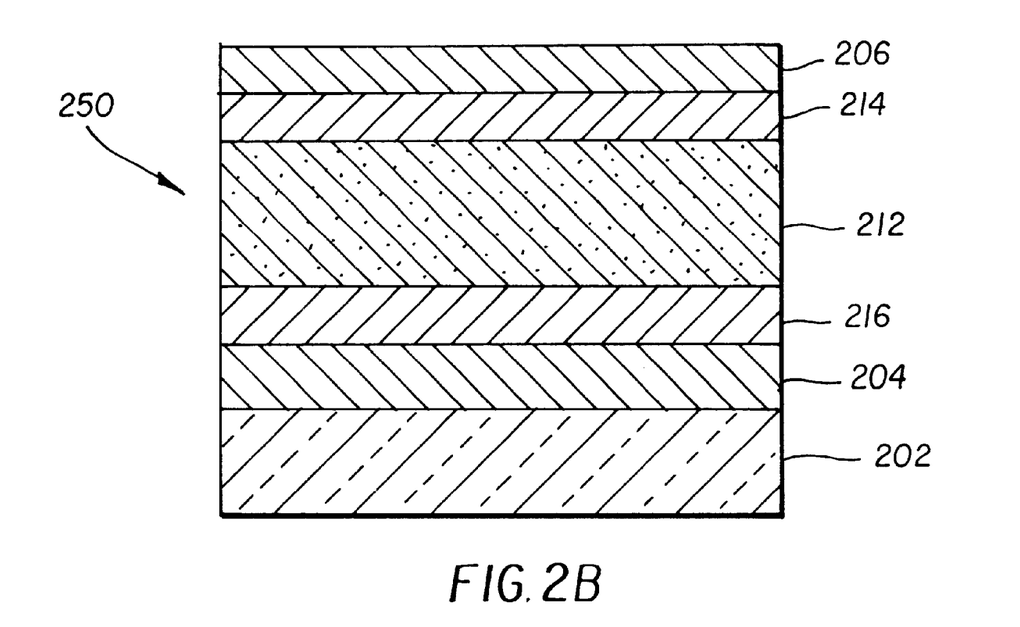
FIG. 2B shows the treated device of FIG. 2A wherein dopant is uniformly dispersed throughout an emissive layer, resulting in light emission from the device which is modified by the dopant diffusion.

Turning now to FIGS. 2A and 2B, there are shown devices which illustrate processing steps which, taken together, illustrate another aspect of the present invention for making an organic light-emitting device with additional layers.

FIG. 2A shows the untreated organic light-emitting device 200 which differs from the untreated organic light emitting device 100 of FIG. 1A in that it now contains a hole transport layer 216 and an electron transport layer 214 over the anode 204 and substrate 202. As before, the dopant layer 210 is placed in the dopant receiving layer 208. A cathode, 206 is provided as before. Upon heating the dopant layer 210 diffuses as shown by arrows 240.

FIG. 2B shows the resultant organic light-emitting device 250 with the anode 204, the hole-transporting layer 216, the electron-transporting layer 214, and the cathode 206 over the substrate 202, and the formation of the emissive layer 212.

Figure 3A:
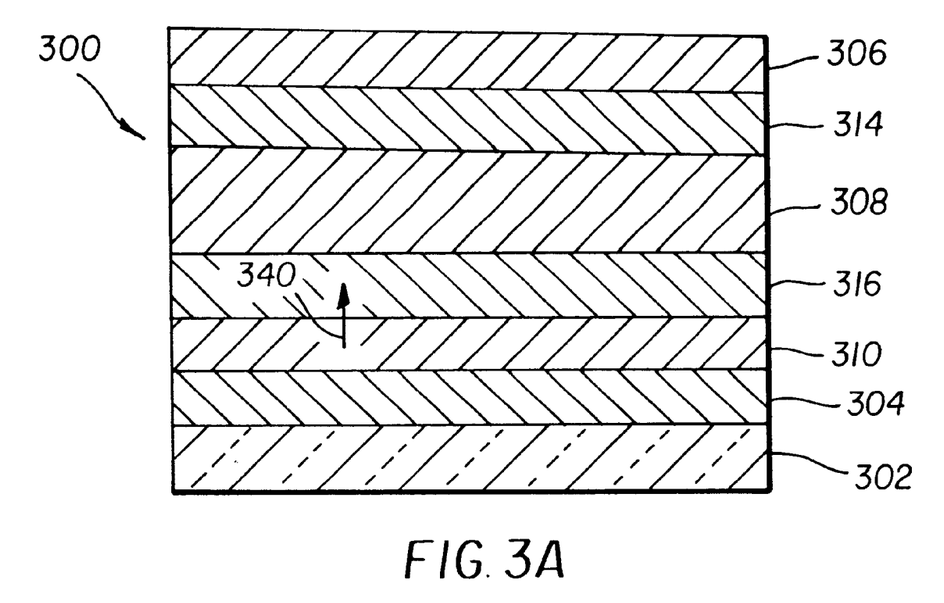
FIGS. 3A and 3B show the sequence of process steps for making an organic light-emitting device to produce a organic light emitting device, where two additional layers are included in the device, namely a hole-transport layer and an electron transport layer and a different initial location for the dopant layer.
Figure 3B:
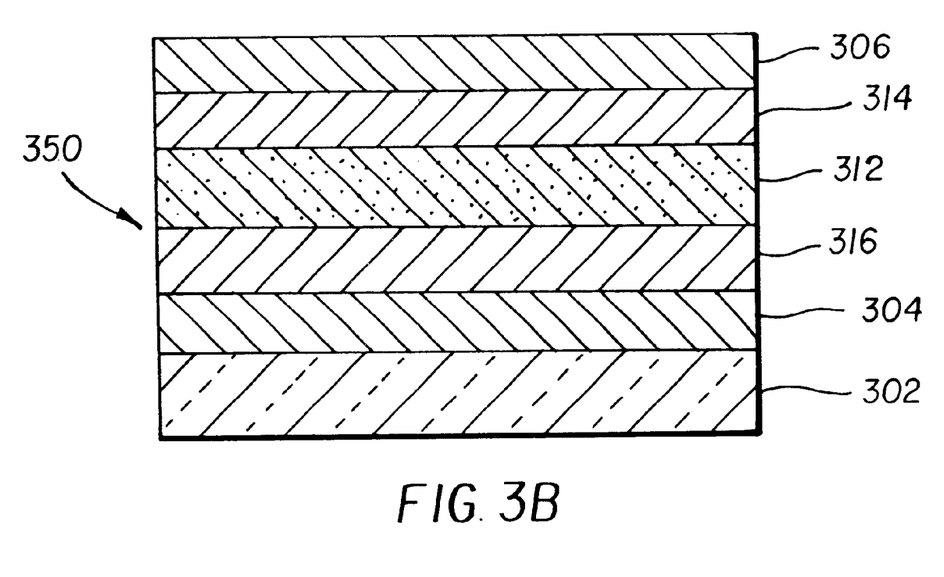

Turning now to FIGS. 3A and 3B, there are shown devices which illustrate processing steps which, taken together, illustrate yet another aspect of the present invention for making an organic light-emitting device with additional layers FIG. 3A shows the untreated organic light-emitting device 300 which differs from the untreated organic light emitting device 200 of FIG. 2A in that now the dopant layer 310 is placed on the anode 304 and over the substrate 302. As before, the hole transporting layer 316, the dopant receiving layer 308, the electron transporting layer 314 and a cathode 306 are provided. Upon heating the dopant layer 310 diffuses as shown by arrows 340.

FIG. 3B shows the resultant organic light-emitting device 350 with the anode 304, the hole-transporting layer 316, the electron-transporting layer 314, and the cathode 306 over the substrate 302, and the formation of the emissive layer 312.

Figure 4A:
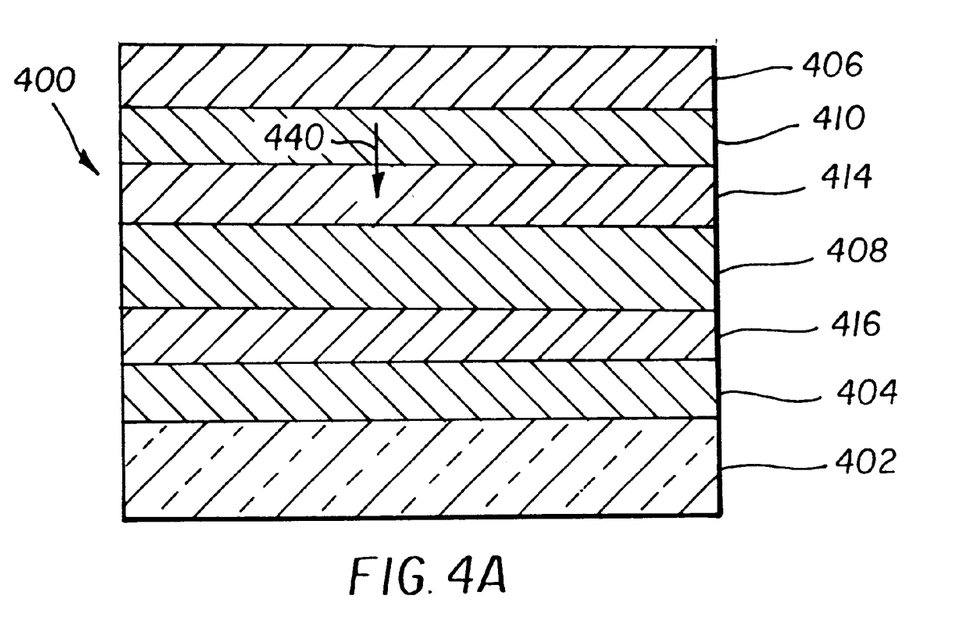
FIGS. 4A and 4B show the sequence of process steps for making an organic light-emitting device to produce a organic light emitting device, where two additional layers are included in the device, namely a hole-transport layer and an electron transport layer and a still different initial location for the dopant layer.
Figure 4B:
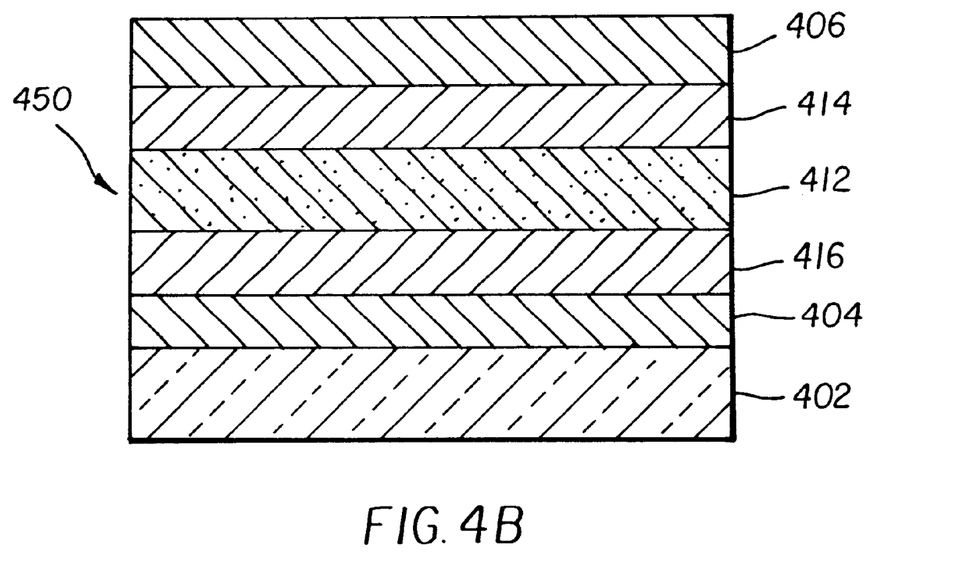

Turning now to FIGS. 4A and 4B, there are shown devices which illustrate processing steps which, taken together, illustrate yet another aspect of the present invention for making an organic light-emitting device with additional layers.

FIG. 4A shows the untreated organic light-emitting device 400 which differs from the device of FIG. 3A in that the dopant layer 410 is now placed on the electron transport layer 410 and over the substrate 402. As before, the hole transporting layer 416, the dopant receiving layer 408, the electron transporting layer 414.and a cathode 406 are provided. Upon heating the dopant layer 410 diffuses as shown by arrows 440.

FIG. 4B shows the resultant organic light-emitting device 450 with the anode 404, the hole-transporting layer 416, the electron-transporting layer 414, and the cathode 406 over the substrate 402, and the formation of the emissive layer 412.

Figure 5A:
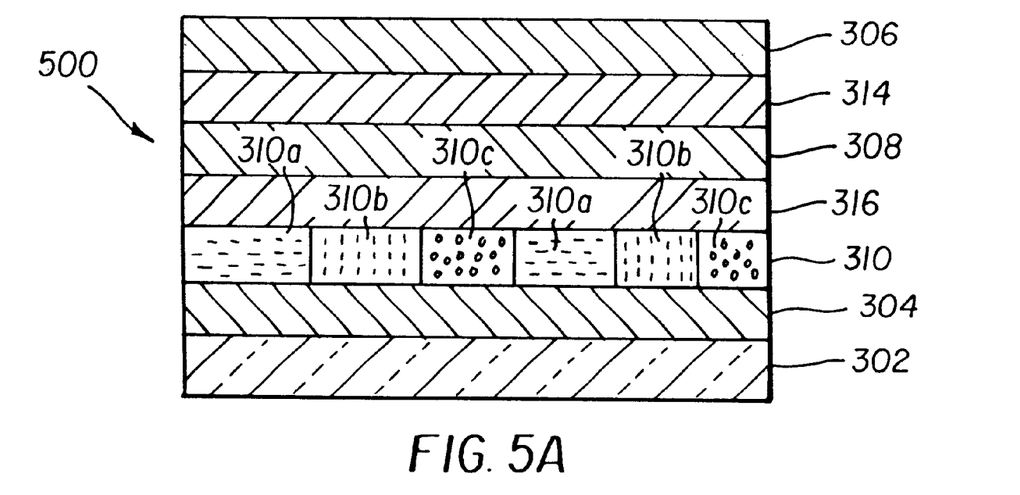
FIGS. 5A and 5B are similar to FIGS. 3A and 3B except they show a patterned dopant layer.
Figure 5B:
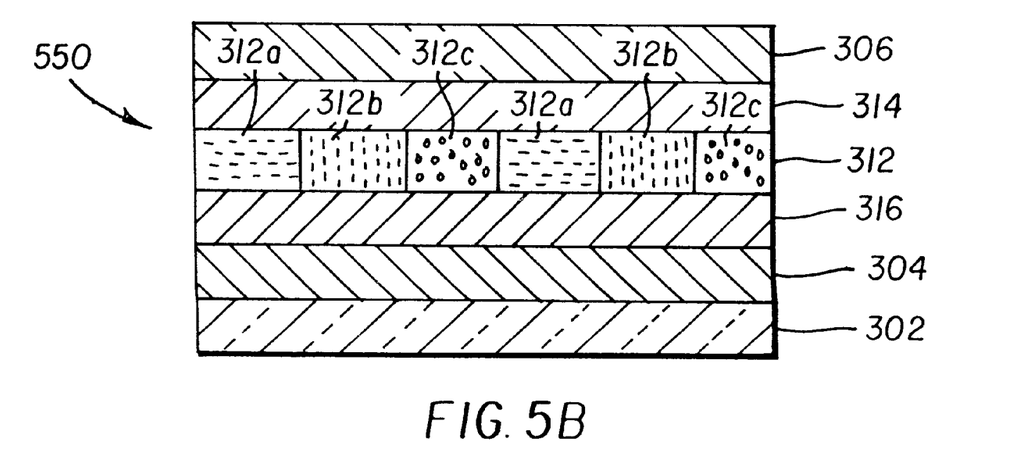

Turning now to FIGS. 5A and 5B which are similar to FIGS. 3A and 3B, where parts correspond the same reference numerals will be used. It will be noted that in FIGS. 5A and 5B the dopant layer 310 is deposited and patterned by conventional techniques such as vacuum deposition through an aperture mask, ink jet printing, thermal dye diffusion printing, offset printing, wax transfer printing or other printing techniques to yield patterned dopant in different areas 310*a*, 301*b*, and 310*c*, as shown. The anode 304 and cathode 306 are provided as shown and the dopant receiving layer 308 and the dopant layer 310 are disposed between such anode 304 and cathode 306. This structure is now heated at a temperature and time sufficient to cause dopant to diffuse from the dopant layer 310 into the dopant receiving layer 308 to form the emissive layer 312 so that when an electrical potential is applied between the anode 304 and cathode 306 light will be emitted from the emissive layer 312 yielding patterned colored emissive layers 312*a*, 312*b*, 312*c*, as shown.

EXAMPLES

The following examples are presented for a further understanding of the invention. For purposes of clarity, the material and the layers formed therefrom will be abbreviated as given below.

ITO: indium tin oxide (anode)
NPB: 4,4'-bis-[N-(1-naphthyl)-N-phenylamino]-biphenyl (hole-transporting layer)
Alq: tris(8-quanolinato-N1,08)-aluminum (light-emitting layer; electron-transporting layer)
MgAg: magnesium:silver at a ratio of 10:1 by volume (cathode)
DCJTB: 4-(dicyanomethylene)-2-t-butyl-6-(1,1,7,7-tetramthyljulolidyl-9-enyl)-4H-pyran (dopant)
Rubrene 9,10,11,12-tetraphenylnapthacene

Example 1

A device, constructed for measurement of electrophotoluminescence, was constructed as follows:
a) a light-transmissive anode of ITO-coated glass was washed with detergent solution then high-pressure deionized water, and dried with a nitrogen stream and a heat lamp;
b) cleaned under an oxygen plasma for 30 seconds at a 40% flow, 300 watts, then treated in a $CHF_3$ plasma for 10 seconds at a 40% flow, 100 watts, both at a pressure less than 40 mTorr;
c) a 75 nm thick NPB layer was deposited over the ITO anode by conventional vacuum evaporation;
d) a 75 nm thick Alq was formed over the NPB layer by conventional vacuum evaporation; and
e) a 400 nm thick MgAg layer was coated over the Alq dopant layer by conventional vacuum evaporation. This device is abbreviated as:
ITO/NPB(75)/Alq(75)/MgAg

Example 2

A device, designated for measurement of photoluminescence, was constructed was constructed in the manner of Example 1, but with an additional dopant layer as follows:

a) a light-transmissive anode of ITO-coated glass was washed with detergent solution then high-pressure deionized water, and dried with a nitrogen stream and a heat lamp;
b) cleaned under an oxygen plasma for 30 seconds at a 40% flow, 300 watts, then treated in a $CHF_3$ plasma for 10 seconds at a 40% flow, 100 watts, both at a pressure less than 40 mTorr;
c) a 75 nm thick NPB layer was deposited over the ITO anode by conventional vacuum evaporation;
d) 4 nm of Rubrene, 5.3%, was co-evaporated with a 75 nm thick Alq over the NPB layer by conventional vacuum evaporation; and
e) a 400 nm thick MgAg layer was coated over the Alq dopant layer by conventional vacuum evaporation. This device is abbreviated as:
ITO/NPB(75)/Rubrene(4):Alq(75)/MgAg

Example 3

Another organic light-emitting device was constructed in the following manner:
a) a light-transmissive anode of ITO-coated glass was washed with detergent solution then high-pressure deionized water, and dried with a nitrogen stream and a heat lamp;
b) cleaned under an oxygen plasma for 30 seconds at a 40% flow, 300 watts, then treated in a $CHF_3$ plasma for 10 seconds at a 40% flow, 100 watts, both at a pressure less than 40 mTorr;
c) a 4 nm thick Rubrene layer was deposited over the ITO anode by conventional vacuum evaporation;
d) a 75 nm thick NPB layer was deposited over the Rubrene layer by conventional vacuum evaporation; and
e) a 400 nm thick MgAg layer was coated over the Alq dopant layer by conventional vacuum evaporation. This device is abbreviated as:
ITO/Rubrene(4)/NPB(75)/Alq(75)/MgAg

Example 4

A organic light-emitting device was constructed in the same manner as Example 3.

Example 5

Still another organic light-emitting device was constructed in the following manner:
a) a light-transmissive anode of ITO-coated glass was washed with detergent solution then high-pressure deionized water, and dried with a nitrogen stream and a heat lamp;
b) cleaned under an oxygen plasma for 30 seconds at a 40% flow, 300 watts, then treated in a $CHF_3$ plasma for 10 seconds at a 40% flow, 100 watts, both at a pressure less than 40 mTorr;
c) a 75 nm thick NPB layer was deposited over the ITO anode by conventional vacuum evaporation;
d) a 4 nm thick Rubrene layer was deposited over the NPB layer by conventional vacuum evaporation; and
e) a 400 nm thick MgAg layer was coated over the Alq dopant layer by conventional vacuum evaporation. This device is abbreviated as:
ITO//NPB(75)/Rubrene(4)/Alq(75)/MgAg

Example 6

A final organic light-emitting device was constructed in the following manner:

a) a light-transmissive anode of ITO-coated glass was washed with detergent solution then high-pressure deionized water, and dried with a nitrogen stream and a heat lamp;

b) cleaned under an oxygen plasma for 30 seconds at a 40% flow, 300 watts, then treated in a $CHF_3$ plasma for 10 seconds at a 40% flow, 100 watts, both at a pressure less than 40 mTorr;

c) a 4 nm thick Rubrene layer was deposited over the ITO anode by conventional vacuum evaporation d) a 1 nm thick DCJTB layer was deposited over the Rubrene layer by conventional vacuum evaporation e) a 75 nm thick NPB layer was deposited over the DCJTB layer by conventional vacuum evaporation; and f) a 400 nm thick MgAg layer was coated over the Alq dopant layer by conventional vacuum evaporation. This device is abbreviated as:
ITO/Rubrene(4)/DCJTB(1)/NPB(75)/Alq(75)/MgAg The spectral radiance of the emitted light of each of the above examples were measured under a current density of 20 mA/cm2 with equipment available from Photo Research Laboratory (Model PR650) before and after heat treatment. The results are shown in the table below.

| Example | Heating Temperature (° C.) | Duration (Hours) | Before Treatment Wavelength of Maximum Emission (nm) | Before Treatment Efficiency (Watts/Amp) | After Treatment Wavelength of Maximum Emission (nm) | After Treatment Efficiency (Watts/Amp) |
| --- | --- | --- | --- | --- | --- | --- |
| 1. | 104 | 3.5 | 540 | 0.017 | 540 | 0.022 |
| 2. | 105 | 3.5 | 568 | 0.040 | 568 | 0.048 |
| 3. | 104 | 3.5 | 540 | 0.018 | 564 | 0.037 |
| 4. | 90 | 3.5 | 540 | 0.022 | 540 | 0.021 |
|    |    | Additional 32 hours |  |  | 540 | 0.023 |
| 5. | 105 | 3.5 | 564 | 0.008 | 564 | 0.025 |
| 6. | 105 | 5.5 |  |  | 540 | 0.023 |

The invention has been described in detail with particular reference to certain preferred embodiments thereof, but it will be understood that variations and modifications can be effected within the spirit and scope of the invention.

| PARTS LIST | |
| --- | --- |
| 100 | organic light-emitting device |
| 102 | substrate |
| 104 | anode |
| 106 | cathode |
| 108 | dopant receiving layer |
| 110 | dopant layer |
| 112 | emissive layer |
| 140 | direction of diffusion of the dopant |
| 150 | organic light-emitting device after heat treatment |
| 200 | organic light-emitting device |
| 202 | substrate |
| 204 | anode |
| 206 | cathode |
| 208 | dopant receiving layer |
| 210 | dopant layer |
| 212 | emissive layer |

-continued

| PARTS LIST | |
| --- | --- |
| 214 | electron-transporting layer |
| 216 | hole-transporting layer |
| 240 | direction of diffusion of the dopant |
| 250 | organic light-emitting device after heat treatment |
| 300 | organic light-emitting device |
| 302 | substrate |
| 304 | anode |
| 306 | cathode |
| 308 | dopant receiving layer |
| 310 | dopant layer |
| 310a | patterned dopant |
| 310b | patterned dopant |
| 310c | patterned dopant |
| 312 | emissive layer |
| 312a | patterned colored emissive layer |
| 312b | patterned colored emissive layer |
| 312c | patterned colored emissive layer |
| 314 | electron-transporting layer |
| 316 | hole-transporting layer |
| 340 | direction of diffusion of the dopant |
| 350 | organic light-emitting device after heat treatment |
| 400 | organic light-emitting device |
| 402 | substrate |
| 404 | anode |
| 406 | cathode |
| 408 | dopant receiving layer |
| 410 | dopant layer |
| 412 | emissive layer |
| 414 | electron-transporting layer |
| 416 | hole-transporting layer |
| 440 | direction of diffusion of the dopant |
| 450 | organic light-emitting device after heat treatment |

What is claimed is:

1. A method of making an electroluminescent device having a substrate, and at least one dopant receiving layer containing a host material which when doped provides an emissive layer, comprising the steps of:

(a) providing at least one dopant layer having a dopant disposed over or under the dopant receiving layer;

(b) providing an anode and a cathode so that the dopant receiving layer and the dopant layer are disposed between such anode and cathode; and (c) heating the electroluminescent device to cause the dopant to diffuse from the dopant layer into the dopant receiving layer and forming the emissive layer having uniformly dispersed dopant in the host material.

2. A method of making an electroluminescent device having a substrate, and at least one dopant receiving layer containing a host material which when doped provides an emissive layer, comprising the steps of:

(a) providing at least one dopant layer having a dopant disposed over or under the dopant receiving layer;

(b) providing an anode and a cathode so that the dopant receiving layer and the dopant layer are disposed between such anode and cathode; and (c) heating the structure formed by steps (a)–(b) at a temperature and time sufficient to cause dopant to diffuse from the dopant layer into the dopant receiving layer to form the emissive layer so that when an electrical potential is applied between the anode and cathode light will be emitted from the emissive layer.

3. The method of claim 2 wherein the heating step includes heating the structure at a temperature range of 50° C. to 250° C. for a time sufficient to cause the dopant to be diffused into the dopant receiving layer.

4. A method of making an electroluminescent device having a substrate, and at least one dopant receiving layer containing a host material which when doped provides an emissive layer, comprising the steps of:

(a) depositing and patterning at least one dopant layer having a dopant disposed over or under the dopant receiving layer;

(b) providing an anode and a cathode so that the dopant receiving layer and the dopant layer are disposed between such anode and cathode; and (c) heating the structure formed by steps (a)–(b) at a temperature and time sufficient to cause dopant to diffuse from the dopant layer into the dopant receiving layer to form the emissive layer so that when an electrical potential is applied between the anode and cathode light will be emitted from the emissive layer.

5. The method of claim 4 wherein the depositing and patterning step includes depositing and patterning at least one layer and providing different dyes in different patterned portions corresponding to different colored light emitting pixels so that when an electrical potential is applied between the anode and cathode different colored light emitting pixels will be produced.

6. The method of claim 4 wherein the dopant layer is patterned by: ink jet printing, thermal dye diffusion printing, offset printing, or wax transfer printing.

7. The method of claim 4 wherein the dopant layer is patterned by vacuum depositing dopant material through an aperture mask.

* * * * *